(12) United States Patent
Aoki et al.

(10) Patent No.: US 6,977,130 B2
(45) Date of Patent: Dec. 20, 2005

(54) METHOD OF MANUFACTURING AN ELECTRONIC CIRCUIT AND MANUFACTURING APPARATUS OF AN ELECTRONIC CIRCUIT

(75) Inventors: Hideo Aoki, Yokohama (JP); Chiaki Takubo, Tokyo (JP); Atsuko Iida, Yokohama (JP); Yasuyuki Hotta, Tokyo (JP); Naoko Yamaguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 10/618,631

(22) Filed: Jul. 15, 2003

(65) Prior Publication Data

US 2004/0197487 A1 Oct. 7, 2004

(30) Foreign Application Priority Data

Jul. 15, 2002 (JP) .......................... P2002-205819
Jul. 9, 2003 (JP) .......................... P2003-272415

(51) Int. Cl.⁷ .......................... G03G 13/16; H05C 1/00; B05D 1/04
(52) U.S. Cl. .................. 430/126; 427/458; 205/126; 118/621
(58) Field of Search .................. 430/11, 126; 427/458; 205/126; 118/621

(56) References Cited

U.S. PATENT DOCUMENTS 4,585,319 A * 4/1986 Okamoto et al. ............. 399/96
4,588,617 A * 5/1986 Oka .......................... 427/443.1
4,897,326 A 1/1990 Marengo
6,524,758 B2 * 2/2003 Eberlein et al. .............. 430/11

FOREIGN PATENT DOCUMENTS

JP 08-056077 2/1996
JP 2001-284769 10/2001

OTHER PUBLICATIONS

Japanese Patent Office machine assisted English language translation of JP 2001-284769.*

* cited by examiner

Primary Examiner—John L Goodrow
(74) Attorney, Agent, or Firm—Finnegan, Henderson, Farabow, Garrett & Dunner, L.L.P.

(57) ABSTRACT

A method of manufacturing an electronic circuit satisfying demands for cost reduction, diversified small-quantity production, and a shorter cycle of design, manufacture, evaluation, correction, and so on is provided. The method includes at least forming a first pattern or forming a second pattern. Forming the first pattern comprises: forming a visible image on an electrostatic latent image formed on a photosensitive base, by the adhesion of charged particles essentially made of a resin; transferring the visible image onto the intermediate transfer base by the contact and pressurization of the visible image; heating/softening on the intermediate transfer base; and transferring a heated/softened resin layer onto a base material by the contact and pressurization of the resin layer. In forming the second pattern, using charged particles containing conductive metal particulates, a conductor metal layer is formed by electroless plating after a metal-containing resin pattern is transferred similarly to the first pattern formation.

22 Claims, 10 Drawing Sheets

METHOD OF MANUFACTURING AN ELECTRONIC CIRCUIT AND MANUFACTURING APPARATUS OF AN ELECTRONIC CIRCUIT

CROSS-REFERENCE TO RELATED APPLICATIONS

This application is based upon and claims the benefit of priorities from the prior Japanese Patent Application No. 2002-205819 filed on Jul. 15, 2002, and the prior Japanese Patent Application No. 2003-272415 filed on Jul. 9, 2003, which claims priority of Japanese Patent Application No. 2002-205819; the entire contents of which are incorporated herein by references.

BACKGROUND

1. Field of the Invention

The present invention relates to a method of manufacturing an electronic circuit and a manufacturing apparatus of an electronic circuit.

2. Description of the Related Art

Conventional manufacturing methods of circuit boards are largely classified into the following two methods: (1) a subtractive method and (2) a build-up method.

(1) The subtractive method is a method in which a substrate constituted of, for example, a copper (Cu) foil and an insulating layer bonded together is subjected to steps of resist coating, exposure, developing, Cu foil etching, resist removal, and so on in sequence, thereby forming a conductor pattern.

(2) The build-up method is a method in which an insulating layer forming step including steps of bonding a photosensitive resin layer, exposure, developing, etching, and so on and a conductor layer forming step including steps of metal thin film forming, resist coating, exposure, developing, plating, resist removal, and so on are alternated, thereby forming a multilayer circuit.

In both of the methods, however, the need for forming masks used for exposure in advance has caused cost increase and long time for designing and preparing the masks. In addition, the cost and delivery time of the circuit board have been greatly influenced by the correction of the masks, if the need for the correction should arise.

In recent years, new methods of forming circuits by electrophotographing (disclosed, for example, Japanese Patent Laid-Open Application No. 2001-284769) have been provided in place of the abovementioned methods. In these methods, an image of electric charges (electrostatic latent image) in the shape of a circuit pattern is formed on the surface of a photosensitive base, and after charged particles for circuit formation are brought into electrostatic adhesion with this electrostatic latent image, a visible image made of the charged particles is transferred onto a ceramic green sheet, and thereafter fixed by heat.

With such electrophotography, however, it has been impossible in principle to impart an electrostatic property to conductive particles. It is barely possible to impart the electrostatic property to a metal oxide film, but the formation of a conductive pattern has been difficult due to extreme difficulty in adjusting the thickness and quality of the oxide film and controlling the quantity of electric charges.

Therefore, a method has been proposed such that an insulative resin as a binder is mixed with metal particles and a charge control agent or the like is added to the mixture, thereby balancing an electrostatic property and conductivity.

However, in a pattern formed by this method, due to the existence of the insulative resin serving as the binder among the metal particles, an electrical resistance value is higher by about three digits than that of a typical circuit board in which a highly conductive metal such as Cu is used as a wiring conductor. Therefore, the use of this pattern as a wiring circuit has not been possible.

Further, in the circuit pattern formed on the ceramic green sheet by the aforementioned method, though the electrical resistance can be lowered to some extent by removing the binder resin by burning, it has been still impossible to obtain sufficient electric conductivity as a wiring circuit. In addition, the removal of the binder resin by burning is a technique limitedly used for ceramic substrates and cannot be adopted for substrates in which resin such as epoxy resin is used as a base material.

Moreover, as for the composition of the charged particles for circuit formation, the content of metal particles needs to be increased in light of electric characteristics. However, conductivity and imparting of the electrostatic property are in a trade-off relation, which has posed such a problem that the increase in metal particle content results in difficulty in controlling the electrostatic property. Therefore, the metal particle content needs to be adjusted to balance the electrostatic property and conductivity. Especially, in order to form a microscopic pattern such as a circuit pattern with high precision, controlling the electrostatic property is extremely important, but the industrial production of conductive resin which can achieve both high precision in circuit formation and good electric characteristics has been extremely difficult.

As a method of overcoming this problem, Japanese Patent Laid-Open Application No. Hei 8-56077 discloses a method of forming a circuit selectively by etching after forming a pattern of an etching resist on a metal film by electrophotography. This method is advantageous in that conductivity in a conventional resin substrate can be ensured since this method can use a copper clad laminate or the like which is made by bonding a Cu foil on a base material such as glass epoxy.

In this method, however, it has been necessary for a resin material for pattern formation to have not only an electrostatic property necessary and appropriate for electrophotography but also etching proof indispensable as a resist and removability after etching. Moreover, this method has not been able to fully satisfy demands such as cost reduction and a shorter cycle of design, production, and so on.

An object of the present invention is to provide a method of manufacturing an electronic circuit and a manufacturing apparatus of an electronic circuit that can fully satisfy demands such as cost reduction, diversified small-quantity production, and a shorter cycle of design, production, evaluation, correction, and so on.

SUMMARY

According to a first aspect of the present invention, provided is a method of manufacturing an electronic circuit including at least one of forming a first pattern and forming a second pattern. Forming the first pattern comprises: forming an electrostatic latent image in a predetermined pattern on a first photosensitive base; forming a first visible image on the first photosensitive base on which the electrostatic latent image is formed, by bringing charged particles essentially made of resin into electrostatic adhesion with the first photosensitive base; transferring the first visible image formed on the first photosensitive base onto a first intermediate transfer base, by bringing the first visible image into contact with and pressing the first visible image onto the first intermediate transfer base; forming an integrated resin layer by heating the first visible image transferred onto the first intermediate transfer base to soften the resin constituting the charged particles; and transferring the integrated resin layer onto a first base material by bringing the resin layer into contact with and pressing the resin layer onto the first base material. Forming the second pattern comprises: forming an electrostatic latent image in a predetermined pattern on a second photosensitive base; forming a second visible image on the second photosensitive base on which the electrostatic latent image is formed, by bringing metal-containing charged particles essentially made of resin and containing metal particulates into electrostatic adhesion with the second photosensitive base; transferring the second visible image formed on the second photosensitive base onto a second intermediate transfer base, by bringing the second visible image into contact with and pressing the second visible image onto the second intermediate transfer base; forming an integrated metal-containing resin layer by heating the second visible image transferred onto the second intermediate transfer base to soften the resin constituting the metal-containing charged particles; transferring the metal-containing resin layer onto a second base material by bringing the metal-containing resin layer into contact with and pressing the metal-containing resin layer onto the second base material; and forming a conductor metal layer by electroless plating on the metal-containing resin layer transferred onto the second base material.

According to a second aspect of the present invention, provided is an method of manufacturing a electronic circuit including at least one of forming a first pattern and forming a second pattern. Forming the first pattern comprises: forming an electrostatic latent image in a predetermined pattern on a first photosensitive base; forming a first visible image on the first photosensitive base on which the electrostatic latent image is formed, by bringing charged particles essentially made of resin into electrostatic adhesion with the first photosensitive base; and transferring the first visible image formed on the first photosensitive base onto a first base material electrostatically. Forming the second pattern comprises: forming an electrostatic latent image in a predetermined pattern on a second photosensitive base; forming a second visible image on the second photosensitive base on which the electrostatic latent image is formed, by bringing metal-containing charged particles essentially made of resin and containing metal particulates into electrostatic adhesion with the second photosensitive base; transferring the second visible image formed on the second photosensitive base onto a second base material electrostatically; and forming a conductor metal layer by electroless plating on the second visible image transferred onto the second base material.

According to a third aspect of the present invention, provided is a manufacturing apparatus of an electronic circuit comprising: a photosensitive drum; a mechanism configured to form an electrostatic latent image in a predetermined pattern on the photosensitive drum; a developing mechanism configured to form a visible image on the photosensitive drum on which the electrostatic latent image is formed, by bringing charged particles essentially made of resin into electrostatic adhesion with the photosensitive drum; an intermediate transfer drum; an intermediate transfer mechanism configured to transfer the visible image formed on the photosensitive drum onto the intermediate transfer drum, by bringing the visible image into contact with and pressing the visible image onto the intermediate transfer drum; a mechanism configured to heat the visible image transferred onto the intermediate transfer drum to soften the resin constituting the charged particles; and a base material transfer mechanism configured to transfer a layer of the softened resin onto a base material by bringing the layer of the resin into contact with and pressing the layer of the resin onto the base material.

According to a fourth aspect of the present invention, provided is a manufacturing apparatus of an electronic circuit comprising: a photosensitive drum; a mechanism configured to form an electrostatic latent image in a predetermined pattern on the photosensitive drum; a developing mechanism configured to form a visible image on the photosensitive drum on which the electrostatic latent image is formed, by bringing charged particles essentially made of resin into electrostatic adhesion with the photosensitive drum; and a base transfer mechanism configured to transfer onto a base material the visible image formed on the photosensitive drum electrostatically.

BRIEF DESCRIPTION OF THE DRAWINGS

The present invention will be described with reference to the drawings. These drawings are presented only for the illustrative purpose and in no respect, are intended to limit the present invention.

DETAILED DESCRIPTION

According to the present invention, demands such as cost reduction, diversified small-quantity production, and a shorter cycle of design, production, evaluation, correction, and so on can be fully satisfied in manufacturing electronic circuits.

Specifically, according to one embodiment of the present invention, the formation of an electronic circuit such as a multilayer circuit board without using any exposure mask is made possible in such a manner that at least one step is performed out of a step of forming an insulating pattern that is a first pattern by electrophotographing and a step of forming a pattern of a metal-containing resin layer similarly by electrophotographing and thereafter, electrolessly plating this layer to form a conductive pattern that is a second pattern. Consequently, mask production becomes unnecessary and the cycle of design, production, evaluation, correction, and so on can be made shorter.

Further, the electronic circuit can be formed directly from digitalized design data, which can realize cost reduction and diversified small-quantity production without lowering production efficiency.

Hereinafter, a method of manufacturing an electronic circuit and a manufacturing apparatus of an electronic circuit according to embodiments of the present invention will be explained with reference to the drawings.

Figure 1:
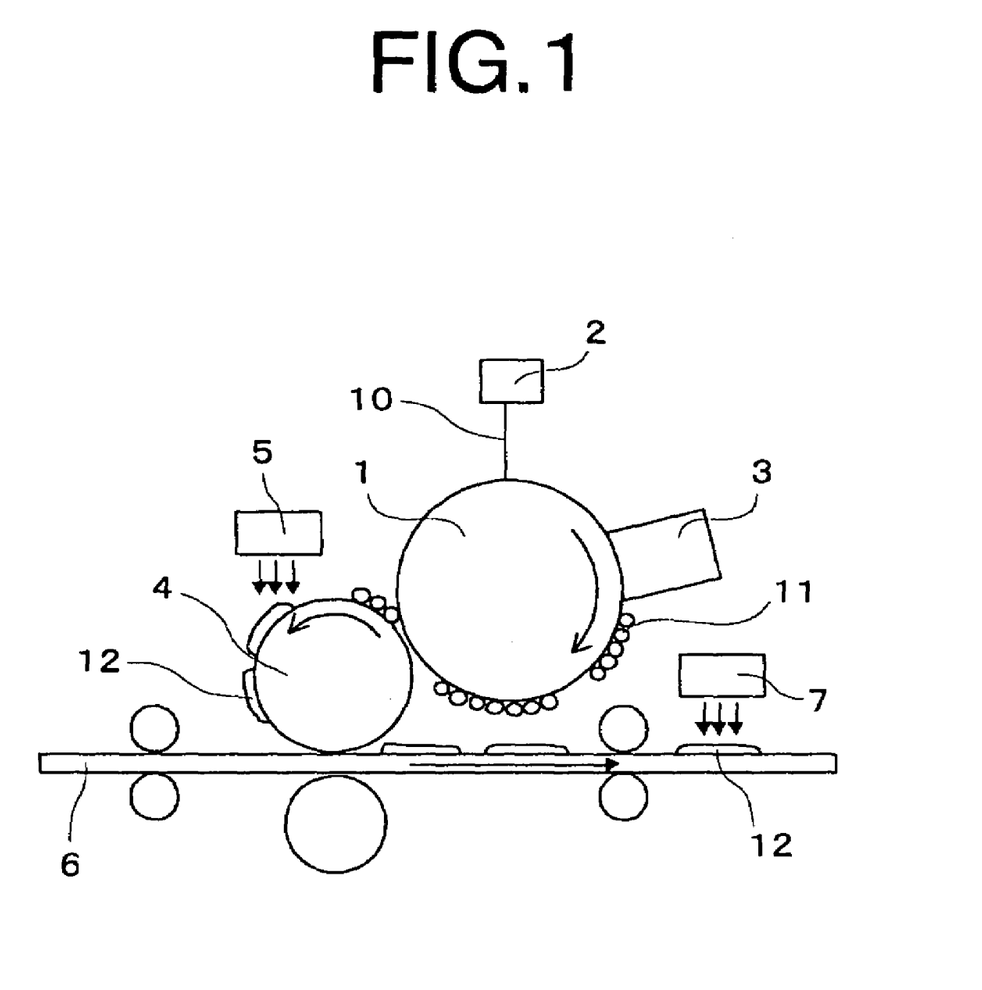
FIG. 1 is a view schematically showing a forming apparatus of an insulating pattern used in a first embodiment of the present invention.
Figure 2:
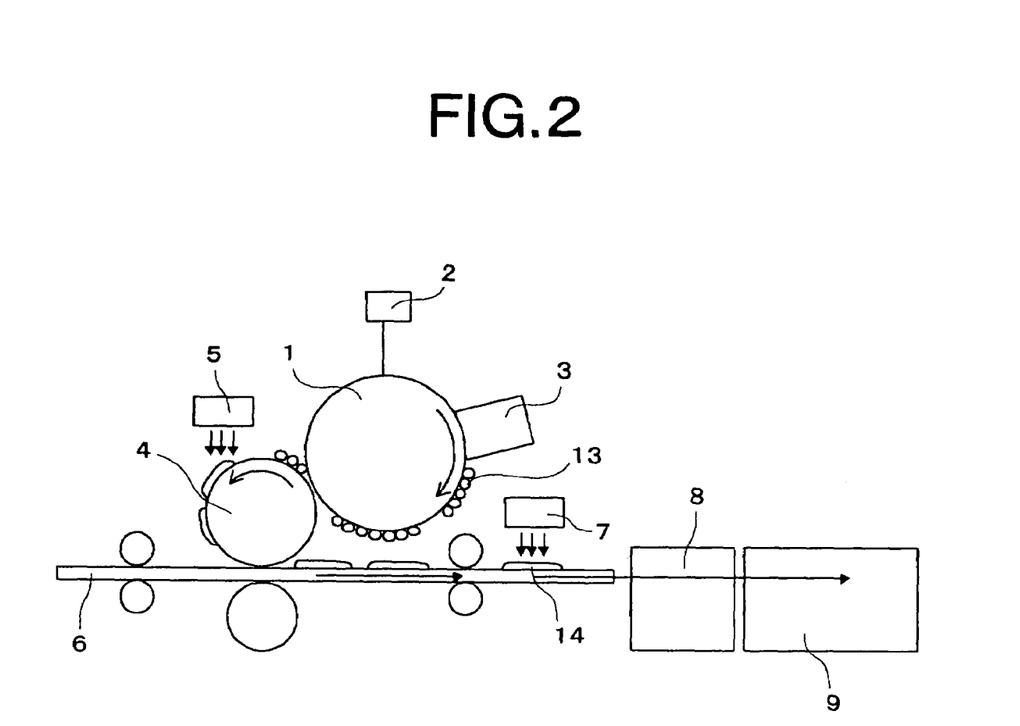
FIG. 2 is a view schematically showing a forming apparatus of a conductor pattern in the first embodiment of the present invention.

FIG. 1 is a view schematically showing a forming apparatus of an insulating pattern used in a first embodiment of the present invention, and FIG. 2 is a view schematically showing a forming apparatus of a conductor pattern used in the first embodiment. In FIG. 1 and FIG. 2, the reference numeral 1 denotes a photosensitive drum, 2 denotes a laser generation/scan unit, 3 denotes a developing unit, 4 denotes an intermediate transfer drum, 5 denotes a heating unit for intermediate transfer base, 6 denotes a base material for circuit board formation, and 7 denotes a unit for curing resin by heating or light irradiation, respectively. In FIG. 2, the reference numeral 8 denotes a resin etching/removing unit and 9 denotes an electroless plating apparatus, respectively.

The first embodiment includes a forming step of an insulating pattern and a forming step of a conductor pattern. The apparatus shown in FIG. 1 is used for forming an insulating pattern. In the forming step of an insulating pattern, the photosensitive drum 1 is first uniformly charged by a not-shown electrifier while being rotated in the arrow direction so that the surface thereof has a certain potential (for example, minus charges). Concrete charging methods includes a scorotron charging method, a roller charging method, a brush charging method, and the like.

Next, the laser generation/scan unit 2 irradiates the photosensitive drum 1 with a laser beam 10 according to an image signal. Then, the minus charges on a portion irradiated with the laser beam 10 are removed to form an image of charges (electrostatic latent image) in a predetermined pattern on the surface of the photosensitive drum 1.

The developing unit 3 brings electrified resin particles (charged resin particles) 11 into electrostatic adhesion with the electrostatic latent image thus formed on the photosensitive drum 1 to form (develop) a visible image. The charged resin particles 11 whose diameter is 6 $\mu$m to 8 $\mu$m, more preferably 10 $\mu$m or larger, are stored in the developing unit 3 and supplied for development the resin particles 11 to the photosensitive drum 1 by a supply mechanism. For this development, charged area development or reversal development is used.

B-staged thermosetting resin that is a solid at room temperature is usable as the resin. As the B-staged thermosetting resin, epoxy resin, polyimide resin, and phenol resin are available, and a charge control agent may be added when necessary.

As a supply and developing system of the resin particles 11, a wet or dry toner transfer technique in a well-known electrophotographic copying system is applicable.

Next, a pattern of the visible image formed of the resin particles 11 on the surface of the photosensitive drum 1 is brought into contact with and pressed onto the surface of the intermediate transfer drum 4 and is transferred onto the surface of the intermediate transfer drum 4 using tackiness of the resin. The rotation of both the photosensitive drum 1 and the intermediate transfer drum 4 causes the resin particles 11 to be pressed onto the surface of the intermediate transfer drum 4, so that the pattern of the visible image is transferred due to the tackiness of the resin particles 11. The resin particles 11 remaining on the surface of the photosensitive drum 1 after this transferring are removed and collected by a not-shown cleaning unit.

The intermediate transfer drum 4 has been heated by the heating unit 5 to a temperature necessary and sufficiently high for softening the resin. Because of this, the particles of the B-staged thermosetting resin transferred onto the intermediate transfer drum 4 are softened, and thereby an integrated resin layer 12 is formed. The heating unit 5 may be disposed inside the intermediate transfer drum 4. The heating temperature is set to a value high enough to soften the B-staged thermosetting resin.

Next, the softened resin layer 12 is brought into contact with and pressed onto a desired base material 6 in the softened state, and thereby it is transferred onto the base material 6 owing to tackiness of the resin.

Thereafter, the B-staged thermosetting resin layer transferred onto the base material 6 is heated or irradiated with light to be cured by the resin curing unit 7.

In this way, an insulating pattern excellent in thermal, mechanical, and environment-proof characteristics can be formed on the base material 6 for circuit board formation.

The inventors of the present invention prepared particles being 10 $\mu$m in diameter constituted of B-staged epoxy resin essentially composed of bisphenol-A and acid anhydride, and formed an insulating pattern by the above-described method. An insulating pattern with the thickness of 30 $\mu$m having an opening being 100 $\mu$m in diameter was allowed to be formed with high precision.

In the first embodiment, the apparatus shown in FIG. 2 is used for forming a conductor pattern. As is seen in the enlarged view of FIG. 3, used are metal-containing resin particles 13 each essentially composed of B-staged thermosetting resin (for example, epoxy resin) 13$a$ that is a solid at room temperature with 1 wt % or less conductive metal particulates 13$b$ mixed therein, the conductive metal particulates 13$b$ being, for example, 0.5 $\mu$m or smaller in diameter. The metal-containing resin particles 13 are used instead of the resin particles (charged resin particles) 11 and the similar steps to those in the aforementioned formation of the insulating pattern are carried out, and a metal-containing resin layer 14 is consequently transferred and formed on the base material 6.

Figure 3:
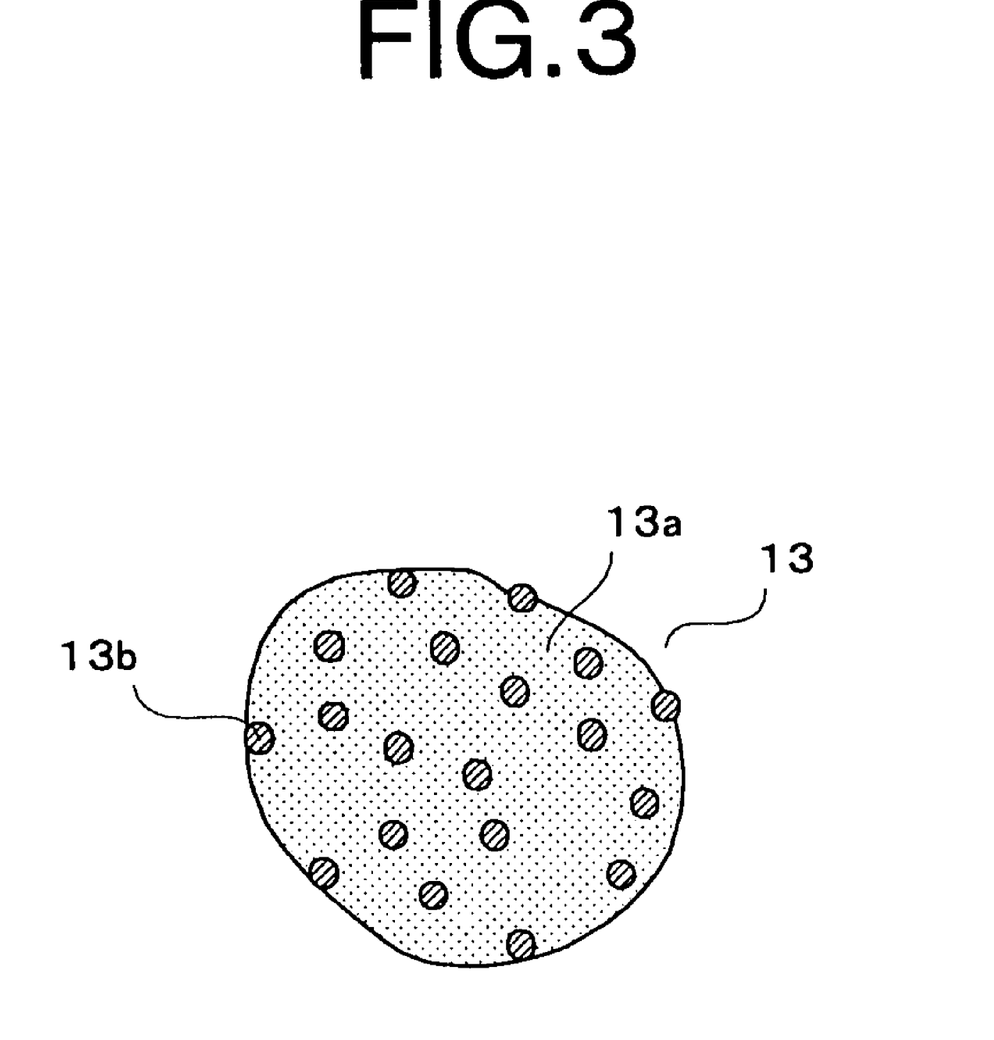
FIG. 3 is a sectional view showing the structure of a metal-containing resin particle used for forming the conductor pattern of the first embodiment of the present invention.

Here, at least one kind of metal particulates selected from a group consisting of Pt, Pd, Cu, Au, Ni, and Ag are preferably used as the conductive metal particulates 13$b$. These metal particulates will be nuclei of electroless plating which will be described later and act as a catalyst on the progress of plating reaction. The use of Pd among these particulates is especially desirable.

Next, the workpiece (the base material 6) goes through the resin curing unit 7, where it is heated or irradiated with light, and thereby the metal-containing resin layer 14 containing the B-staged thermosetting resin is cured. Thereafter, the workpiece goes through the Cu electroless plating apparatus 9. Then, Cu is selectively precipitated on the metal-containing resin layer 14, the aforementioned conductive metal particulates serving as nuclei. In this way, a conductor pattern excellent in conductivity can be formed.

Incidentally, the workpiece may go through the resin light etching unit 8 before being put into the electroless plating apparatus 9, where a part of the resin in the metal-containing resin layer 14 is removed by etching. The resin etching causes the conductive metal particles such as Pd to be exposed on the surface of the metal-containing resin layer 14, resulting in efficient electroless plating.

The smaller diameter of the metal-containing resin particles 13 is the more preferable in forming the conductor pattern. More specifically, in forming the insulating pattern, thickness of the insulating pattern is preferably large in view of electric insulation and accordingly, the larger diameter of the resin (insulative resin) is the more preferable. On the other hand, in forming the conductor pattern, since the conductive metal particulates 13b in the metal-containing resin particle 13 only need to serve as nuclei of the electroless plating and a wiring pattern has to be microscopically formed, the smaller diameter of the metal-containing particle 13 is the more preferable. Actually, when epoxy resin particles with the diameter of 5 $\mu$m containing Pd particulates were used and a laser irradiating unit having about 1200 dpi precision and a photosensitive drum unit were employed, it was possible to form a microscopic conductive wiring pattern with line/space=30 $\mu$m/30 $\mu$m.

In the first embodiment, the forming step of the insulating pattern and the forming step of the conductor pattern which are described above are alternated so that a multilayer circuit board can be formed. Incidentally, both in the insulating pattern forming step and the conductor pattern forming step, the B-staged thermosetting resin can be easily removed by a solvent or the like if it is before the thermosetting resin is cured by heating or the like. This means that the removal or correction of the insulating pattern or the conductor pattern is possible.

Next, a second embodiment of the present invention will be explained.

Figure 4:
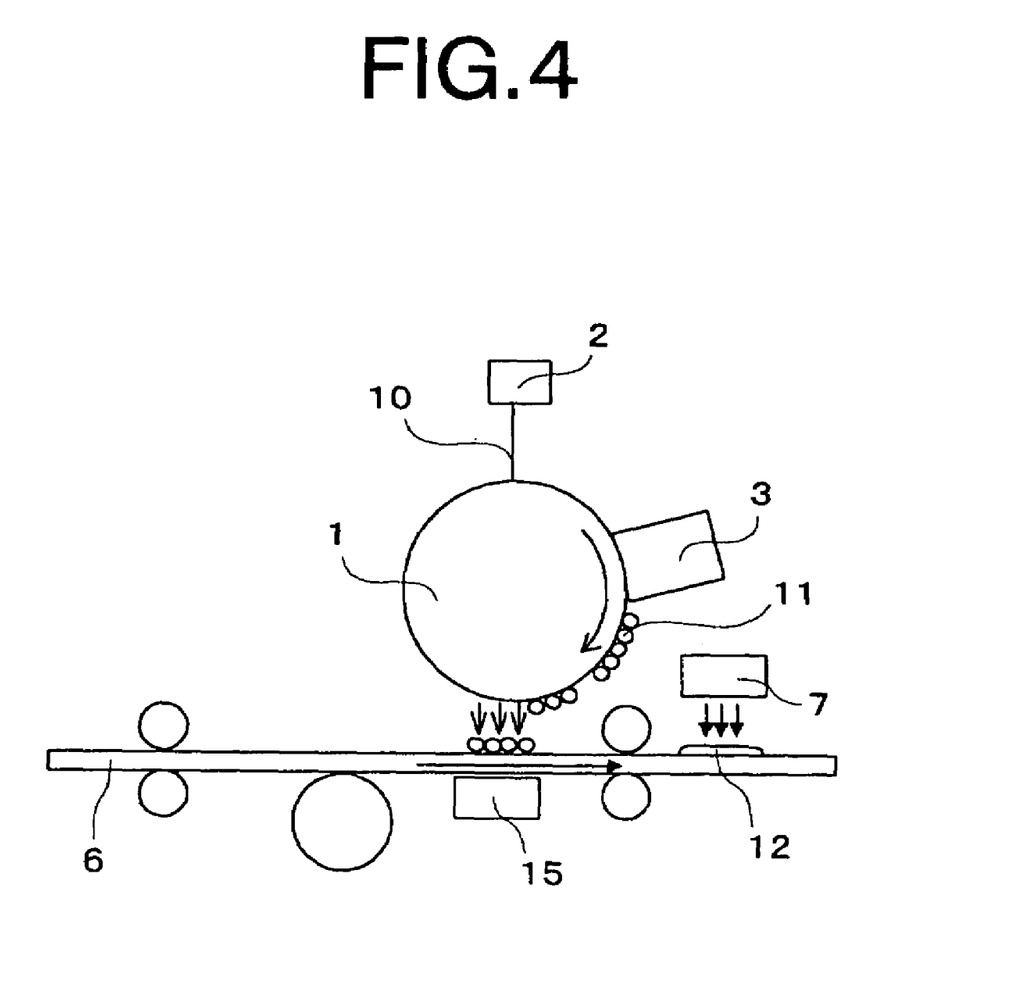
FIG. 4 is a view schematically showing a forming apparatus of an insulating pattern used in a second embodiment of the present invention.
Figure 5:
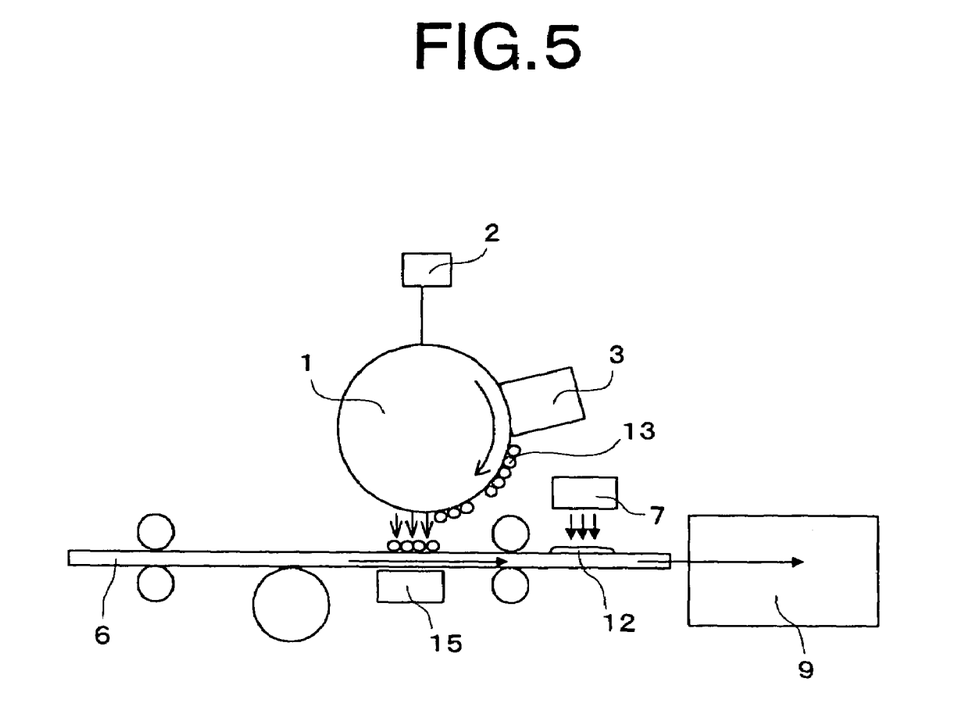
FIG. 5 is a view schematically showing a forming apparatus of a conductor pattern used in the second embodiment of the present invention.

FIG. 4 is a view schematically showing a forming apparatus of an insulating pattern in the second embodiment of the present invention, and FIG. 5 is a view schematically showing a forming apparatus of a conductor pattern used in the second embodiment. In FIG. 4, the same reference numerals are used to designate the same portions as those in FIG. 1 and the explanation thereof will be omitted. In FIG. 5, the same reference numerals are used to designate the same portions as those in FIG. 2 and the explanation thereof will be omitted. In FIG. 4 and FIG. 5, the reference numeral 15 denotes an electric field generating apparatus.

The second embodiment includes a forming step of an insulating pattern and a forming step of a conductor pattern. The apparatus shown in FIG. 4 is used for forming an insulating pattern. In the forming step of an insulating pattern, a photosensitive drum 1 is charged while being rotated so that the surface thereof has a certain potential, and thereafter, a laser generation/scan unit 2 irradiates the surface of the photosensitive drum 1 with a laser beam 10 to form an electrostatic latent image in a predetermined pattern on the surface of the photosensitive drum 1.

Subsequently, a developing unit 3 brings electrified resin particles (charged resin particles) 11 into electrostatic adhesion with the electrostatic latent image on the photosensitive drum 1 to form a visible image. Similarly to the first embodiment, B-staged thermosetting resin that is a solid at room temperature is used as the resin. The resin particle is 6 $\mu$m to 8 $\mu$m in diameter, more preferably 10 $\mu$m or larger.

Next, the electric field generating apparatus 15 electrostatically transfers onto a desired base material 6 a pattern of the visible image which is formed of the resin particles 11 on the surface of the photosensitive drum 1. The base material 6 takes charges due to the electric field generated from the electric field generating apparatus 15 and the visible image formed of the charged resin particles 11 is transferred onto this charged base material 6. A well-known method such as a corona charging method, a roller transfer method, or a belt transfer method is used as a method of generating the electric field by the electric field generating apparatus 15.

The workpiece goes through a resin curing unit 7 to be heated or irradiated with light so that the B-staged thermosetting resin particles constituting the visible image transferred onto the base material 6 is cured, and thereby a resin layer 12 is formed. In this way, the insulating pattern excellent in thermal, mechanical, environment-proof characteristics can be formed on the base material 6 for circuit board formation.

In the second embodiment, similarly to the first embodiment, in forming a conductor pattern, metal-containing resin particles 13 essentially constituted of B-staged thermosetting resin that is a solid at room temperature with conductive metal particulates mixed therein are used and the apparatus shown in FIG. 5 is used.

To be more specific, after an electrostatic latent image in a predetermined pattern is formed on the photosensitive drum 1 by the laser generation/scan unit 2, the developing unit 3 brings charged metal-containing resin particles 13 into electrostatic adhesion with this electrostatic latent image to thereby form a visible image.

Next, the electric field generating apparatus 15 electrostatically transfers a pattern of the visible image, which is formed of the metal-containing resin particles 13 on the surface of the photosensitive drum 1, onto the desired base material 6 by a method such as charging the base material 6.

The workpiece goes through the resin curing unit 7, where the B-staged thermosetting resin is cured by heating or irradiation with light, and thereby a metal-containing resin layer 14 is formed. Thereafter, the workpiece goes through a Cu electroless plating apparatus 9, where Cu is selectively precipitated on the metal-containing resin layer 14, the conductive metal particulates serving as nuclei. In this manner, a conductor pattern excellent in conductivity can be formed. Then, the insulating pattern forming step and the conductor pattern forming step which are described above are alternated, and a multilayer circuit board can be consequently formed.

In both of the first and second embodiments thus structured, the step of forming the insulating pattern by electrophotography and the step of forming the conductor pattern by forming the resin pattern containing the conductive metal particulates such as Pd similarly by electrophotography and further by electrolessly plating the surface of the resin pattern are carried out in sequence, which allows the multilayer circuit to be formed without using any exposure mask. Further, since the multilayer circuit can be directly formed based on digitalized design data, the multilayer circuit board can be manufactured at low cost and in a short time, which is suitable for diversified small-quantity production.

Moreover, neither the use of photosensitive resin as the resin for pattern formation is necessary, nor resin having printability such as thixotropy and viscosity is particularly necessary. Therefore, the degree of freedom in physicality values (for example, Young's modulus, transition temperature of glass Tg, hygroscopicity, and so on) of the resin is high, and as a result, reliability can be enhanced. Further, owing to the use of the B-staged thermosetting resin and the excellent thermal characteristics after the resin layer is cured, it is possible to fully satisfy heat resistance at a normal soldering temperature (about 220° C. to about 260° C.).

In the forming step of the conductor pattern, the conductive metal particulates serving as the nuclei of the electroless plating are mixed in the B-staged thermosetting resin to form the metal-containing resin layer 14, and thereafter the surface of this metal-containing resin layer 14 is electrolessly plated. This makes it possible to form a conductor pattern excellent in conductivity.

Further, according to the first embodiment, in the insulation pattern forming step and the conductor pattern forming step, the resin particles essentially composed of the B-staged thermosetting resin are transferred onto the photosensitive drum 1 by electrophotography, subsequently transferred onto the intermediate transfer drum 4, and thereafter, heated and cured on this intermediate transfer drum 4 to be integrated. Then, thus formed resin layer 12 or metal-containing resin layer 14 is transferred onto the base material 6. Therefore, the pattern having excellent characteristics can be formed without any void. Further, at the time of the transfer from the intermediate transfer drum 4 onto the base material 6, the resin follows the irregularity of the surface of the base material 6 to easily come in close contact with the base material 6. Consequently, a large pressure is not necessary, which results in only small damages given to the base material 6.

The methods of manufacturing the multilayer circuit board by alternating the insulating pattern forming step and the conductor pattern forming step are explained in the first and second embodiments, but it is also possible to conduct at least one of the insulating pattern forming step and the conductor pattern forming step in the same manner as in the first or the second embodiment, and conduct the other in the same manner as in the second or the first embodiment or by a different well-known method (screen printing, ink jetting, or the like).

It is also possible to manufacture a flexible multilayer circuit board in such a manner that a substrate or a sheet formed of PTFE (polytetrafluoroethylene) resin is used as the base material, the insulating pattern and the conductor pattern are alternately formed thereon in the same manner as in the first or the second embodiment, and thereafter, a portion corresponding to thus formed multilayer circuit is removed from the base material.

It is also possible to use a low-cost circuit board manufactured by a conventional method (for example, a build-up substrate) as the base material to form the conductor pattern thereon in the same manner as in the first or the second embodiment. Further, in manufacturing substrates not requiring heat resistance such as connector wiring substrates, thermoplastic resin such as acrylic resin is usable instead of the B-staged thermosetting resin.

A third embodiment to a seventh embodiment of the present invention will be explained.

Figure 6A:
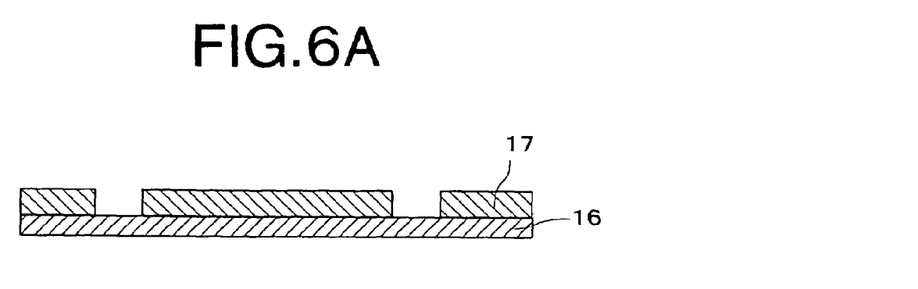
FIG. 6A to FIG. 6E are sectional views each showing a circuit board forming step according to a third embodiment of the present invention.
Figure 6B:
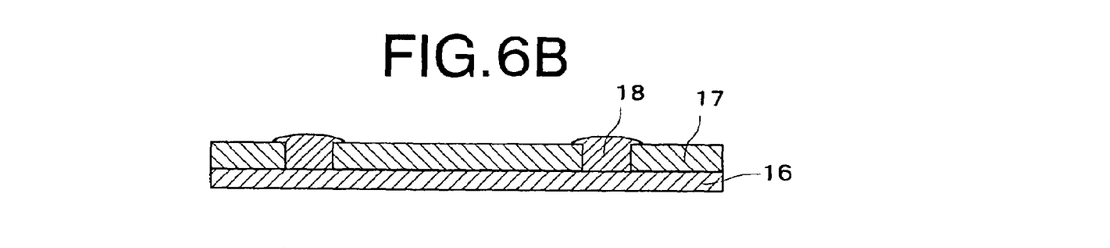

In the third embodiment, a conductive base material such as a Cu plate is used as a base material, and an insulating pattern 17 is formed on this conductive base material 16 in the same manner as in the insulating pattern forming step of the first embodiment as shown in FIG. 6A. Subsequently, as shown in FIG. 6B, the insulating pattern 17 is subjected to electrolytic plating, the Cu plate as the conductive base material 16 serving as an electrode, thereby forming vias 18 made of conductive metal (for example, Cu) in opening portions of the insulating pattern 17.

Figure 6C:
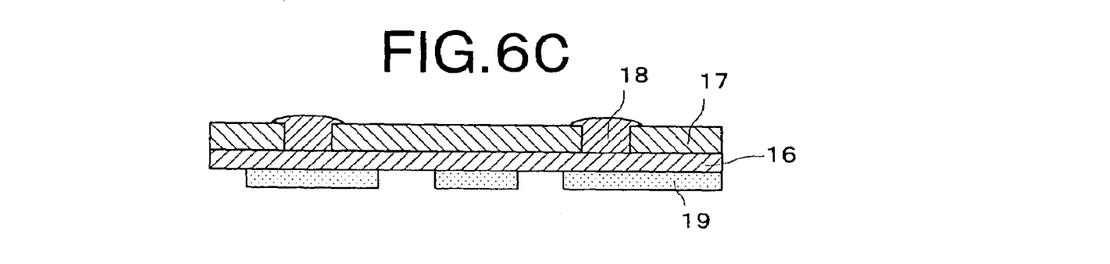
Figure 6D:
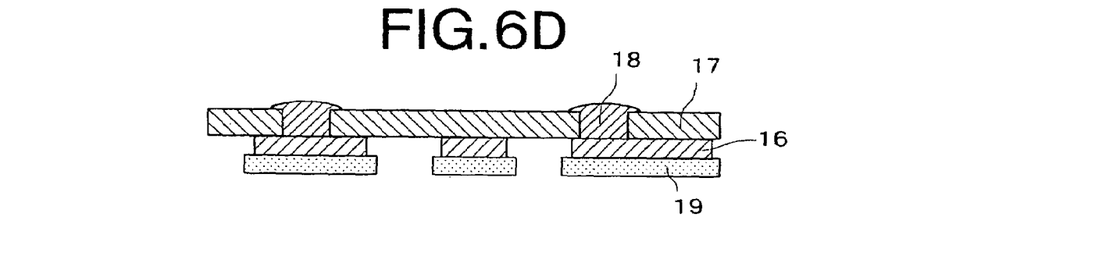

Next, as shown in FIG. 6C, a resist pattern 19 is formed on a rear face of the conductive base material 16 in the same manner as in the insulating pattern forming step of the first embodiment, and thereafter, the conductive base material 16 is etched by wet etching or the like as shown in FIG. 6D. Incidentally, the resist pattern 19 may be formed by photolithography.

Figure 6E:
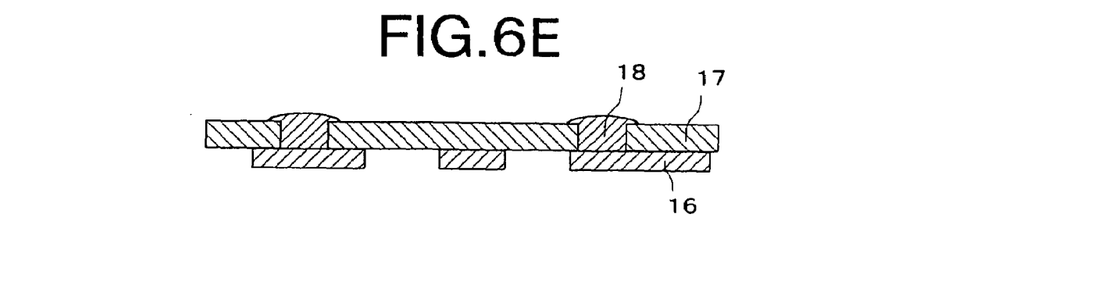

Finally, the resist pattern 19 is removed. Thus, as shown in FIG. 6E, a circuit board having one conductive layer and the vias 18 can be efficiently manufactured. Manufacturing of a low-cost circuit board with a shortened delivery period can be realized without the need for any exposure mask.

Incidentally, it is also possible to etch a copper foil of an ordinary copper clad laminate after a resist pattern is formed on the copper foil in the same manner as in the third embodiment.

Figure 7:
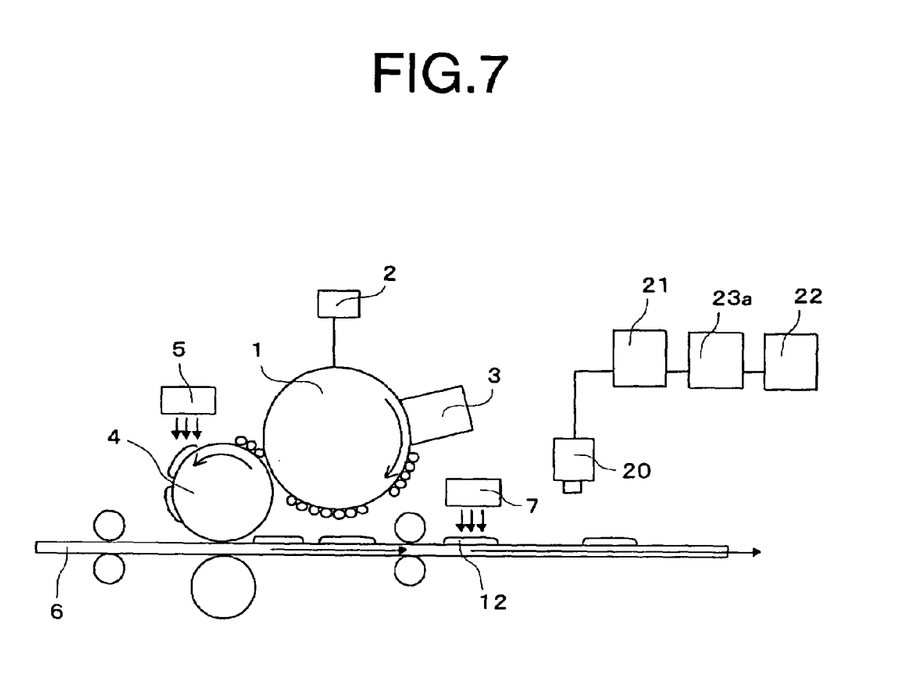
FIG. 7 is a view showing the schematic configuration of a fourth embodiment of the present invention.

In the fourth embodiment, B-staged thermosetting resin (for example, epoxy resin) containing a fluorescent dye is used. As shown in FIG. 7, similarly to the first embodiment, a pattern of a resin layer 12 is formed on a base material 6, and after the thermosetting resin is heated or irradiated with light to be cured by going through a resin curing unit 7, fluorescence from this resin layer 12 is detected for pattern inspection.

A pattern inspector is composed of an imaging unit 20 such as a camera that detects the fluorescence, an image processing unit 21, a design data storage memory 22, and a comparison operation unit 23a. The pattern of the resin layer 12 (or a conductive metal-containing resin layer) formed on the base material 6 is formed based on digitalized data inputted in advance. When data on the pattern of the resin layer 12 detected by the imaging unit 20 is compared, after being taken into the image processing unit 21, with design data stored in the design data storage memory 22 by the comparison operation unit 23a, a pattern defect can be immediately judged.

Incidentally, such a pattern inspector may be displaced on a stage prior to the resin curing unit 7 to conduct inspection before the resin layer or the metal-containing resin layer is cured.

When the pattern defect of the resin layer or the metal-containing resin layer is detected, if it is before the B-staged thermosetting resin is cured, the defective pattern can be easily removed by a solvent or the like and the pattern can be formed again. Further, it is also possible to dispose a position correcting device including such a pattern inspector to add or correct a pattern, which remarkably enhances manufacturing yields. It is also possible to immediately feed back actual evaluation data on electric characteristics and the like to the design data for verification.

Figure 8:
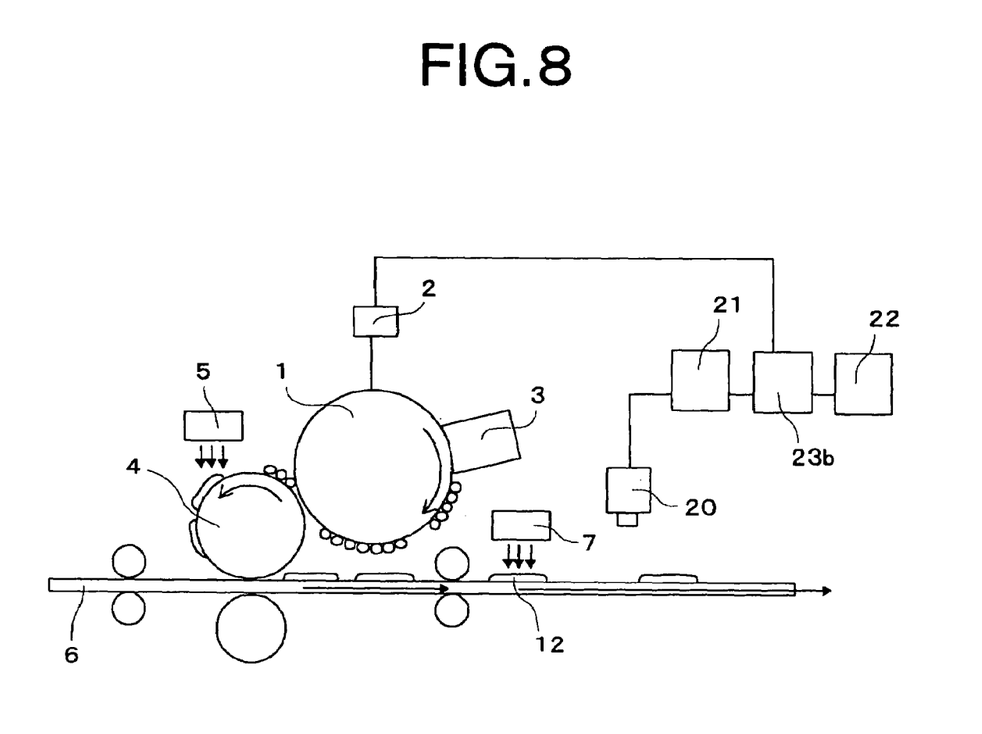
FIG. 8 is a view showing the schematic configuration of a fifth embodiment of the present invention.

In the fifth embodiment, as shown in FIG. 8, provided is a position correcting device composed of an imaging unit 20 that picks up images of a pattern of a resin layer 12 formed on a base material 6 and alignment marks provided on the base material 6 in advance, an image processing unit 21, a design data storage memory 22, and a comparison operation and positional correction calculating unit 23b. The comparison operation and positional correction calculating unit 23b executes a comparison arithmetic operation of data on the pattern of the resin layer 12 and the alignment marks whose images are picked up by the imaging unit 20 with design data inputted in advance and calculates a positional correction amount (x, y, θ). Then, the data on the positional correction amount (x, y, θ) is outputted to a laser generation/scan unit 2 for a photosensitive drum 1 as a displacement amount from the design data, and a laser beam whose irradiation position is corrected based on this data is generated from the laser generation/scan unit 2.

In the fifth embodiment, an electrostatic latent image whose position is thus corrected can be formed on a photosensitive drum 1, which makes it possible to form a pattern excellent in positional precision on the base material. It is also possible to add or correct a pattern, which remarkably enhances manufacturing yields. Incidentally, the positional correction of the pattern is also made possible by moving the position of the base material 6 relatively to the photosensitive drum 1 or an intermediate transfer drum 4.

Figure 9A:
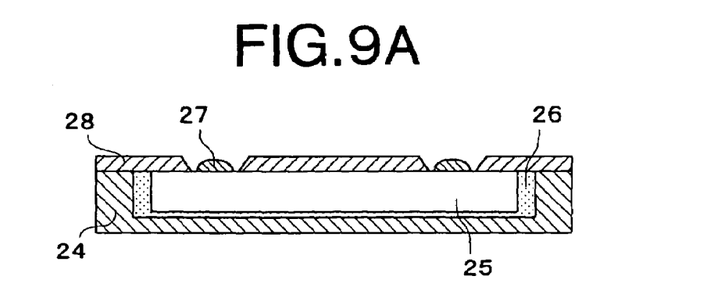
FIG. 9A to FIG. 9D are sectional views showing steps of forming a multilayer circuit on a semiconductor device according to a sixth embodiment of the present invention.
Figure 9B:
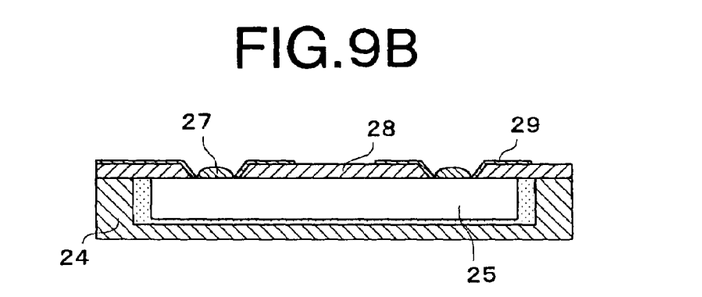
Figure 9C:
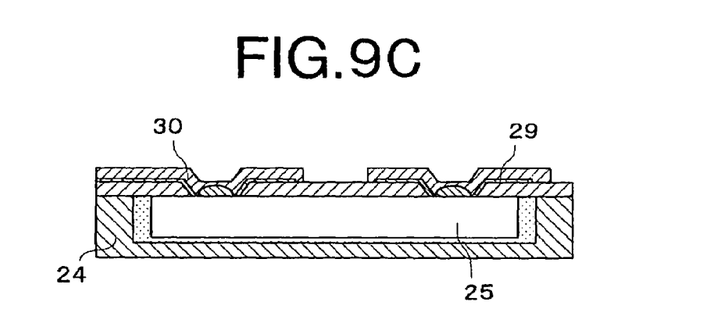
Figure 9D:
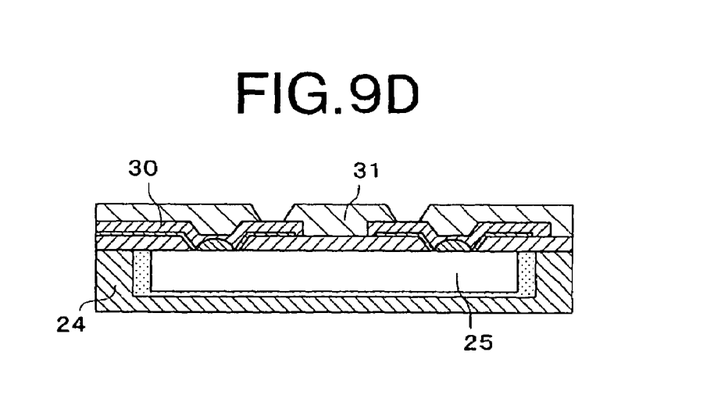

In the sixth embodiment, a multilayer circuit is formed on a semiconductor device having a structure described below. Specifically, as shown in FIG. 9A, a semiconductor chip 25 is accommodated in each recessed portion of a substrate 24 having one or a plurality of recessed portion(s), with an electrode pad (not shown) facing upward, and the semiconductor chip 25 is fixed with an adhesive or the like. An insulating resin 26 is filled in a gap surrounding the semiconductor chip 25, that is, between the semiconductor chip 25 and the substrate 24. The insulating resin 26 can be filled by a dispense method or the like. The insulating resin 26 to be filled desirably has a low viscosity in a view of easiness of filling. The insulating resin 26 is cured after being filled.

The surface of the semiconductor device thus obtained is subjected to the insulating pattern forming step and the conductor pattern forming step in the first embodiment in sequence as shown in FIG. 9A to FIG. 9D, and an insulating pattern is further formed thereon to form a multilayer circuit wiring. In FIG. 9A to FIG. 9D, the reference numeral 27 denotes Au bumps formed on electrode pads of the semiconductor chip 25 by, for example, electrolytic plating, the reference numerals 28 and 29 respectively denote a lower insulating pattern and a metal-containing resin layer transferred and formed in the same manner as in the first embodiment, and the reference numeral 30 denotes an electroless plating layer such as Cu formed on the surface of the metal-containing resin layer 29. The reference numeral 31 denotes an upper insulating pattern transferred and formed by electrophotography in the same manner as in the first embodiment.

Thus, a chip scale package (CSP) on a wafer level or an electronic circuit device in which a circuit is rewired on a wafer can be manufactured. The sixth embodiment is advantageous in that the provision of Au bumps 27 on the electrode pads of the semiconductor chip 25 ensures the wiring connection.

In the sixth embodiment, in order to correct the positional displacement of the semiconductor chip 25, the position of the electrode pads of each semiconductor chip is recognized by an imaging unit such as a camera, and data obtained by this recognition is inputted to a laser generation/scan unit, which enables the correction of image data. This process allows the formation of an insulating pattern and a conductor pattern free of the positional displacement. Accordingly, precision in mounting parts such as the semiconductor chip 25 is not required, and thus any special mounter need not be used in order to cope with the fine pitch between electrodes, which can achieve cost reduction of products.

Figure 10:
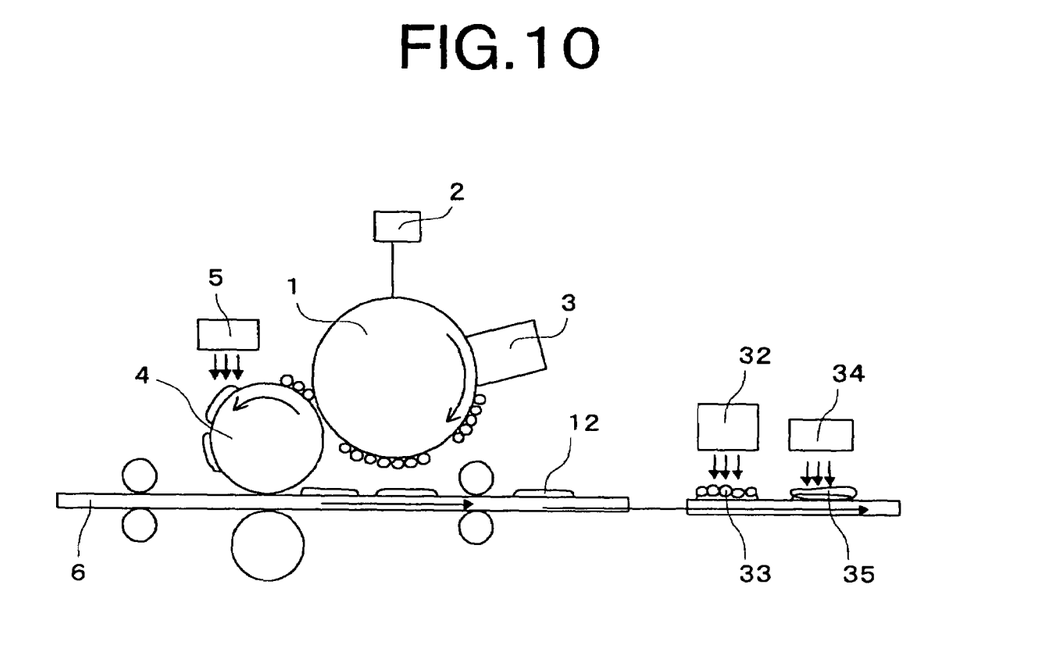
FIG. 10 is a view showing the schematic configuration of a seventh embodiment of the present invention.

In the seventh embodiment, as shown in FIG. 10, after a pattern of a resin layer 12 is formed similarly to the first embodiment, conductive metal particles 33 such as Ag particles are sprayed by a metal particle spraying unit 32 to be brought into adhesion with the surface of the resin layer 12 having viscosity before the resin layer 12 is cured. Then, after the workpiece goes through a resin curing unit (not shown), where the resin is cured, it is pressurized by a pressurizing unit 34. The conductive metal particles 33 adhering to the resin layer 12 are thus deformed so that the metal particles directly join together to become conductive. Through this process, a conductive layer 35 can be formed.

Thereafter, the workpiece goes through an electroless plating apparatus of Cu or the like, when necessary, where Cu on the conductive layer is precipitated. Through this process, a conductive pattern higher in conductivity can be formed.

Incidentally, particles of low-melting metal can be used as the conductive metal particles 33. When the low-melting metal particles are used, the metal can be easily melted only by heating and the metal particles can be thus made conductive. At this time, the resin layer is cured at the same time. As the low-melting metal, solder, for example, Sn/Pb, Sn/Ag, or Sn/Ag/Cu can be used.

The method of forming the conductive layer by spraying the conductive metal particles as described above is also applicable to the formation of a metal-containing resin layer before the metal-containing resin layer transferred and formed on a base material is cured.

It is to be understood that the present invention is not intended to be limited to the specific embodiments described with reference to the drawings and all changes which come within the meaning and range of equivalency of the claims are therefore intended to be embraced therein.

What is claimed is:

1. A method of manufacturing an electronic circuit, comprising at least one of forming a first pattern and forming a second pattern, forming the first pattern comprising:
   forming an electrostatic latent image in a predetermined pattern on a first photosensitive base;
   forming a first visible image on the first photosensitive base on which the electrostatic latent image is formed, by bringing charged particles essentially made of resin into electrostatic adhesion with the first photosensitive base;
   transferring the first visible image formed on the first photosensitive base onto a first intermediate transfer base, by bringing the first visible image into contact with and pressing the first visible image onto the first intermediate transfer base;
   forming an integrated resin layer by heating the first visible image transferred onto the first intermediate transfer base to soften the resin constituting the charged particles; and
   transferring the integrated resin layer onto a first base material by bringing the resin layer into contact with and pressing the resin layer onto the first base material, and forming the second pattern comprising:
   forming an electrostatic latent image in a predetermined pattern on a second photosensitive base;
   forming a second visible image on the second photosensitive base on which the electrostatic latent image is formed, by bringing metal-containing charged particles essentially made of resin and containing metal particulates into electrostatic adhesion with the second photosensitive base;
   transferring the second visible image formed on the second photosensitive base onto a second intermediate transfer base, by bringing the second visible image into contact with and pressing the second visible image onto the second intermediate transfer base;
   forming an integrated metal-containing resin layer by heating the second visible image transferred onto the second intermediate transfer base to soften the resin constituting the metal-containing charged particles;
   transferring the metal-containing resin layer onto a second base material by bringing the metal-containing resin layer into contact with and pressing the metal-containing resin layer onto the second base material; and forming a conductor metal layer by electroless plating on the metal-containing resin layer transferred onto the second base material.

2. The method of manufacturing an electronic circuit as set forth in claim 1, wherein forming the first pattern and forming the second pattern are alternately performed once or alternately repeated a plurality of times.

3. The method of manufacturing an electronic circuit as set forth in claim 1, wherein, in at least one of forming the first pattern and forming the second pattern, the resin constituting the charged particles or the resin constituting the metal-containing charged particles is B-staged thermosetting resin.

4. The method of manufacturing an electronic circuit as set forth in claim 1, wherein at least one of forming the first pattern and forming the second pattern further comprises:
    curing the resin layer transferred onto the first base material or the metal-containing resin layer transferred onto the second base material by heating or light irradiation.

5. The method of manufacturing an electronic circuit as set forth in claim 1, wherein at least one of forming the first pattern and forming the second pattern further comprises:
    bringing low-melting metal particles into adhesion with the resin layer transferred onto the first base material or the metal-containing resin layer transferred onto the second base material; and
    heating and melting the adhering low-melting metal particles.

6. The method of manufacturing an electronic circuit as set forth in claim 1, wherein the resin constituting the charged particles adhering on the first photosensitive base or the resin constituting the metal-containing charged particles adhering onto the second photosensitive base contains a fluorescent substance, and
    at least one of forming the first pattern and forming the second pattern further comprises judging a pattern of the resin containing the fluorescent substance.

7. A method of manufacturing an electronic circuit comprising at least one of forming a first pattern and forming a second pattern,
    forming the first pattern comprising:
    forming an electrostatic latent image in a predetermined pattern on a first photosensitive base;
    forming a first visible image on the first photosensitive base on which the electrostatic latent image is formed, by bringing charged particles essentially made of resin into electrostatic adhesion with the first photosensitive base; and
    transferring the first visible image formed on the first photosensitive base onto a first base material electrostatically, and
    forming the second pattern comprising:
    forming an electrostatic latent image in a predetermined pattern on a second photosensitive base;
    forming a second visible image on the second photosensitive base on which the electrostatic latent image is formed, by bringing metal-containing charged particles essentially made of resin and containing metal particulates into electrostatic adhesion with the second photosensitive base;
    transferring the second visible image formed on the second photosensitive base onto a second base material electrostatically; and forming a conductive metal layer by electroless plating on the second visible image transferred onto the second base material.

8. The method of manufacturing an electronic circuit as set forth in claim 7, wherein forming the first pattern and forming the second pattern are alternately performed once or alternately repeated a plurality of times.

9. The method of manufacturing an electronic circuit as set forth in claim 7,
    wherein, in at least one of forming the first pattern and forming the second pattern, the resin constituting the charged particles or the resin constituting the metal-containing charged particles is B-staged thermosetting resin.

10. The method of manufacturing an electronic circuit as set forth in claim 7, wherein at least one of forming the first pattern and forming the second pattern further comprises:
    curing the resin contained in the first visible image transferred onto the first base material or the resin contained in the second visible image transferred onto the second base material by heating or light irradiation.

11. The method of manufacturing an electronic circuit as set forth in claim 7, wherein at least one of forming the first pattern and forming the second pattern further comprises:
    bringing low-melting metal particles into adhesion with the first visible image transferred onto the first base material or the second visible image transferred onto the second base material; and
    heating and melting the adhering low-melting metal particles.

12. The method of manufacturing an electronic circuit as set forth in claim 7,
    wherein the resin constituting the charged particles adhering on the first photosensitive base or the resin constituting the metal-containing charged particles adhering on the second photosensitive base contains a fluorescent substance, and
    wherein at least one of forming the first pattern and forming the second pattern further comprises judging a pattern of the resin containing the fluorescent substance.

13. A manufacturing apparatus of an electronic circuit, comprising:
    a photosensitive drum;
    a mechanism configured to form an electrostatic latent image in a predetermined pattern on the photosensitive drum;
    a developing mechanism configured to form a visible image on the photosensitive drum on which the electrostatic latent image is formed, by bringing charged particles essentially made of resin into electrostatic adhesion with the photosensitive drum;
    an intermediate transfer drum;
    an intermediate transfer mechanism configured to transfer the visible image formed on the photosensitive drum onto the intermediate transfer drum, by bringing the visible image into contact with and pressing the visible image onto the intermediate transfer drum;
    a mechanism configured to heat the visible image transferred onto the intermediate transfer drum to soften the resin constituting the charged particles;
    a base transfer mechanism configured to transfer a layer of the softened resin onto a base material by bringing the layer of the resin into contact with and pressing the layer of the resin onto the base material; and an electroless plating apparatus in which the resin layer transferred onto the base by the base transfer mechanism is subjected to electroless plating.

14. The manufacturing apparatus of an electronic circuit as set forth in claim 13, further comprising:

a pattern inspector configured to recognize a pattern of the resin layer transferred onto the base by the base transfer mechanism.

15. The manufacturing apparatus of an electronic circuit as set forth in claim 14, further comprising:

a position correcting device configured to correct a position of the pattern of the resin layer.

16. A manufacturing apparatus of an electronic circuit, comprising:

a photosensitive drum;

a mechanism configured to form an electrostatic latent image in a predetermined pattern on the photosensitive drum;

a developing mechanism configured to form a visible image on the photosensitive drum on which the electrostatic latent image is formed, by bringing charged particles essentially made of resin into electrostatic adhesion with the photosensitive drum;

a base transfer mechanism configured to transfer onto a base material the visible image formed on the photosensitive drum electrostatically; and an electroless plating apparatus in which the visible image transferred onto the base by the base transfer mechanism is subjected to electroless plating.

17. The manufacturing apparatus of an electronic circuit as set forth in claim 16, further comprising:

a pattern inspector configured to recognize a pattern of the visible image transferred onto the base by the base transfer mechanism.

18. The manufacturing apparatus of an electronic circuit as set forth in claim 17, further comprising:

a position correcting device configured to correct a position of the pattern of the visible image.

19. The method of manufacturing an electronic circuit as set forth in claim 1, wherein, in forming the second pattern, after a part of the metal-containing resin layer transferred onto the second base material is removed by etching, the conductor metal layer is formed on the metal-containing resin layer by electroless plating.

20. The method of manufacturing an electronic circuit as set forth in claim 1, wherein at least one of forming the first pattern and forming the second pattern has adding a new pattern or correcting a position of the pattern formed.

21. The method of manufacturing an electronic circuit as set forth in claim 7, wherein, in forming the second pattern, after a part of the second visible image transferred onto the second base material is removed by etching, the conductor metal layer is formed on the second visible image by electroless plating.

22. The method of manufacturing an electronic circuit as set forth in claim 7, wherein at least one of forming the first pattern and forming the second pattern has adding a new pattern or correcting a position of the pattern formed.

* * * * *